US009105707B2

United States Patent
Bryant et al.

(10) Patent No.: US 9,105,707 B2
(45) Date of Patent: Aug. 11, 2015

(54) ZRAM HETEROCHANNEL MEMORY

(71) Applicant: INTERNATIONAL BUSINESS MACHINES CORPORATION, Armonk, NY (US)

(72) Inventors: Andres Bryant, South Burlington, VT (US); Lyndon R. Logan, Poughkeepsie, NY (US); Edward J. Nowak, Essex Juntion, VT (US); Robert R. Robison, Colchester, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/949,609

(22) Filed: Jul. 24, 2013

(65) Prior Publication Data
US 2015/0028397 A1    Jan. 29, 2015

(51) Int. Cl.
*H01L 29/78* (2006.01)
*H01L 29/66* (2006.01)
*H01L 27/12* (2006.01)
H01L 27/108 (2006.01)

(52) U.S. Cl.
CPC ............ *H01L 29/78* (2013.01); *H01L 27/1203* (2013.01); *H01L 29/66666* (2013.01); *H01L 29/7841* (2013.01); H01L 27/10802 (2013.01)

(58) Field of Classification Search
USPC ........................................................ 257/288
See application file for complete search history.

(56) References Cited

U.S. PATENT DOCUMENTS

| | | | |
|---|---|---|---|
| 5,448,513 A | 9/1995 | Hu et al. | |
| 6,326,251 B1* | 12/2001 | Gardner et al. | 438/197 |
| 6,333,540 B1* | 12/2001 | Shiozawa et al. | 257/351 |
| 6,805,962 B2 | 10/2004 | Bedell et al. | |
| 6,861,689 B2 | 3/2005 | Burnett | |
| 7,091,075 B2 | 8/2006 | Chaudhry | |
| 7,576,379 B2 | 8/2009 | Anderson et al. | |
| 8,143,656 B2 | 3/2012 | Lee et al. | |
| 8,203,866 B2 | 6/2012 | Gonzalez et al. | |
| 8,362,575 B2 | 1/2013 | Kwok et al. | |
| 8,404,530 B2 | 3/2013 | Ando et al. | |
| 2006/0068555 A1* | 3/2006 | Zhu et al. | 438/303 |
| 2006/0202254 A1 | 9/2006 | Lai et al. | |
| 2006/0286755 A1* | 12/2006 | Brask et al. | 438/299 |
| 2007/0080411 A1 | 4/2007 | Enicks | |
| 2008/0191256 A1* | 8/2008 | Bidan et al. | 257/298 |
| 2010/0087037 A1 | 4/2010 | Anderson et al. | |

(Continued)

OTHER PUBLICATIONS

Okhonin, et al., "New Generation of Z-RAM", IEEE, 2007, pp. 925-928.

*Primary Examiner* — Khaja Ahmad
(74) *Attorney, Agent, or Firm* — Michael Lestrange; Roberts mlotkowski Safran & Cole, P.C.

(57) ABSTRACT

Approaches for zero capacitance memory cells are provided. A method of manufacturing a semiconductor structure includes forming a channel region by doping a first material with a first type of impurity. The method includes forming source/drain regions by doping a second material with a second type of impurity different than the first type of impurity, wherein the second material has a smaller bandgap than the first material. The method includes forming lightly doped regions between the channel region and the source/drain regions, wherein the lightly doped regions include the second material. The method includes forming a gate over the channel region, wherein the second material extends under edges of the gate.

18 Claims, 10 Drawing Sheets

(56) References Cited

U.S. PATENT DOCUMENTS

| | | |
|---|---|---|
| 2011/0079827 A1 | 4/2011 | Ellis-Monaghan et al. |
| 2011/0127580 A1 | 6/2011 | Park et al. |
| 2011/0147842 A1* | 6/2011 | Cappellani et al. ........... 257/365 |
| 2012/0043611 A1 | 2/2012 | Mouli et al. |
| 2012/0080723 A1* | 4/2012 | Lee et al. ...................... 257/192 |
| 2012/0104475 A1 | 5/2012 | Anderson et al. |
| 2012/0146145 A1 | 6/2012 | Anderson et al. |
| 2012/0181578 A1* | 7/2012 | Holt et al. ..................... 257/192 |
| 2013/0026539 A1 | 1/2013 | Tang et al. |
| 2013/0285155 A1* | 10/2013 | Glass et al. ................... 257/369 |

* cited by examiner

ZRAM HETEROCHANNEL MEMORY

FIELD OF THE INVENTION

The invention relates to integrated circuits and, more particularly, to integrated circuit memory devices and methods of manufacture.

BACKGROUND

Zero capacitance random access memory (ZRAM) is a type of DRAM memory based on the floating body effect of silicon on insulator (SOI) process technology. In ZRAM, the floating body effect allows the memory cell to be built without adding a separate capacitor, as the floating body effect takes the place of the conventional capacitor.

A write operation to a ZRAM involves applying a combination of a bias to the drain and a high bias to the gate. To write a one, a medium bias is applied to the drain and gate. Impact ionization generated by the current flow will build up carriers in the body. To write a zero, a negative bias is put on the gate and no voltage is applied to the drain, which flushes the body of any existing carriers without generating any new carriers.

A ZRAM cell is read by applying a high bias on the drain and a zero voltage on the gate measuring the current. This uses the ZRAM device like a bipolar. When the ZRAM is storing a zero, the body has little or no carriers and the bipolar will not activate. When the ZRAM is storing a one, the body voltage is high and the bipolar will turn on and flow high current while at the same time refreshing itself.

A ZRAM cell may have a very high drain bias that is required to operate the cell, which presents reliability problems and also affects the read/write voltage margin. For example, typical drain bias for a ZRAM may be 3V for a read operation and 2.5V for a write operation, which provides only a small 0.5V margin between the read and write operations.

SUMMARY

In a first aspect of the invention, there is a method of manufacturing a semiconductor structure. The method includes forming a channel region by doping a first material with a first type of impurity. The method also includes forming source/drain regions by doping a second material with a second type of impurity different than the first type of impurity, wherein the second material has a smaller bandgap than the first material. The method additionally includes forming lightly doped regions between the channel region and the source/drain regions, wherein the lightly doped regions include the second material. The method further includes forming a gate over the channel region, wherein the second material extends under edges of the gate.

In another aspect of the invention, there is a method of forming a semiconductor structure including: forming a sacrificial gate on a layer of silicon; forming trenches in the layer of silicon; and forming silicon-germanium islands in the trenches. The method also includes: forming a mask on the silicon-germanium islands; removing the sacrificial gate to form a gate trench defined by the mask; and forming a channel region in a portion of the layer of silicon exposed by the gate trench. The method additionally includes forming a gate dielectric and a gate electrode over the channel region and in the gate trench; removing the mask; and forming gate spacers that mask first portions of the silicon-germanium islands. The method further includes: forming source/drain regions in second portions of the silicon-germanium islands; and annealing the structure to cause atoms to migrate from the channel region and the source/drain regions into the first portions of the silicon-germanium islands.

In another aspect of the invention, there is a semiconductor structure including a channel region composed of a first material doped with a first type of impurity. The semiconductor structure includes source/drain regions composed of a second material doped with a second type of impurity different than the first type of impurity, wherein the second material has a smaller bandgap than the first material. The semiconductor structure also includes lightly doped regions between the channel region and the source/drain regions, wherein the lightly doped regions are composed of the second material. The semiconductor structure further includes a gate over the channel region, wherein the second material extends under edges of the gate.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for a ZRAM cell which comprises the structures of the present invention. In still further embodiments, a method in a computer-aided design system is provided for generating a functional design model of a ZRAM cell. The method comprises generating a functional representation of the structural elements of the ZRAM cell.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to integrated circuit memory devices and methods of manufacture. According to aspects of the invention, a ZRAM cell includes a p-type silicon channel, n-type SiGe source drain regions, and lightly doped SiGe regions between the channel and source/drain regions. The lightly doped SiGe region under the gate has a smaller bandgap than intrinsic silicon, as do the SiGe source/drain regions. The smaller bandgaps enhance the impact ionization rate, which permits writing to the ZRAM cell at a lower drain bias. In this manner, implementations of the invention enhance the margin (e.g., difference) between the write voltage and the read voltage for the ZRAM cell.

Figure 1:
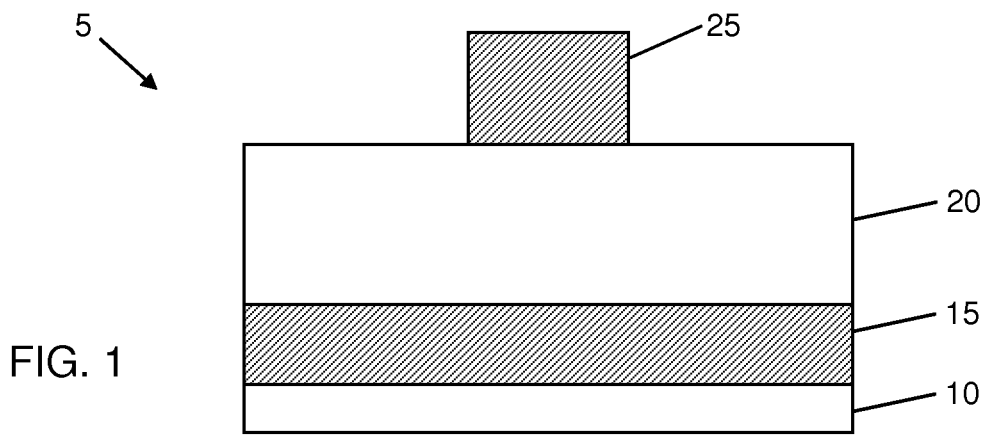
FIGS. 1-9 show views of structures and respective processing steps in accordance with aspects of the invention.

FIGS. 1-9 show views of structures and respective processing steps in accordance with aspects of the invention. More specifically, FIG. 1 shows a portion of a silicon on insulator (SOI) wafer 5 comprising a substrate 10, and insulator layer 15 on the substrate 10, and an active semiconductor layer 20 on the insulator layer 15. The SOI wafer 5 may be fabricated using any suitable conventional technique, such as wafer bonding, etc. The substrate 10, insulator layer 15, and active layer 20 may be composed of conventional materials and have any desired thicknesses in the vertical direction. For example, active layer 20 may comprise single crystal silicon and have a thickness in a range of about 5 nm to about 50 nm. Insulator layer 15 may be composed of oxide, such as silicon dioxide, and may have a thickness of in a range of about 50 nm to about 150 nm. Substrate 10 may be composed of silicon or any other materials used for a substrate carrier, and may have a thickness of about 700 nm. The invention in not limited to these materials and dimensions, however, and any suitable materials and dimensions may be used within the scope of the invention.

Still referring to FIG. 1, a sacrificial gate 25 is formed on the top surface of the active layer 20. In embodiments, the sacrificial gate 25 is composed of a material that may be removed selective to the active layer 20. For example, when the active layer 20 comprises silicon, the sacrificial gate 25 may comprise oxide. The invention is not limited to oxide, however, and the sacrificial gate 25 may be composed of any suitable material such as polysilicon, nitride, etc.

The sacrificial gate 25, which may also be referred to as a dummy gate, mandrel, etc., may be formed using conventional semiconductor fabrication techniques, such as photolithographic masking and etching processes. For example, a layer of oxide material may be formed on the top surface of active layer 20, e.g., by chemical vapor deposition (CVD), thermal oxidation, etc. A photomask may be provided by forming a layer of photoresist material on the layer of oxide material, exposing the photoresist material to a pattern of light, and developing the exposed photoresist material. An etching process, such as a reactive ion etch (RIE), may then be used to remove portions of the layer of oxide material that are not covered by the photomask. After etching, the photomask may be removed using a conventional ashing or stripping process. The un-etched portions of the layer of oxide material that remain after the masking and etching form the sacrificial gate 25.

Figure 2:
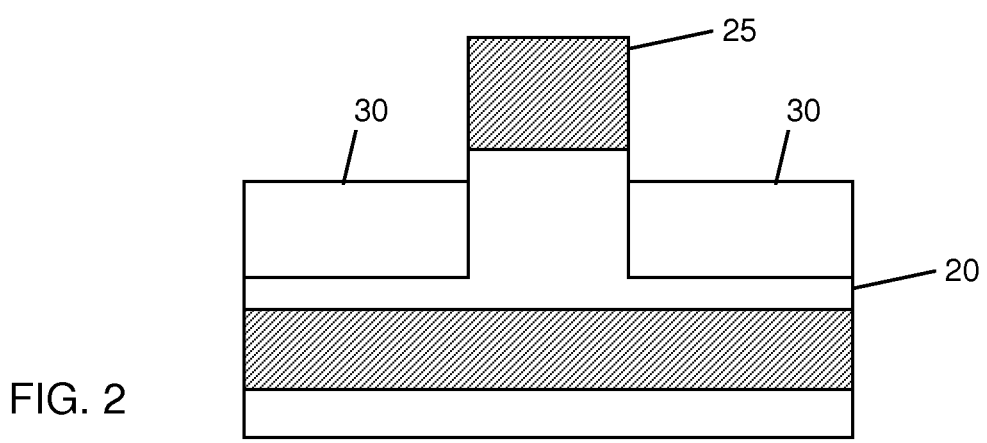

As depicted in FIG. 2, trenches are formed in the active layer 20 by removing portions of the active layer 20 adjacent the sacrificial gate 25, and islands 30 are formed in the trenches. In embodiments, the trenches are formed by an etch (e.g., RIE) having a chemistry that selectively removes exposed portions of the active layer 20 that are not covered by the sacrificial gate 25, without removing the sacrificial gate 25. In embodiments, the etch is a timed etch that results in the trenches extending only partially into the active layer 20. After forming the trenches, the islands 30 may be formed by growing or depositing material in the trenches. For example, the islands 30 may be composed of silicon germanium (SiGe) that is epitaxially grown on exposed surfaces of the active layer 20 in the trenches.

Figure 3:
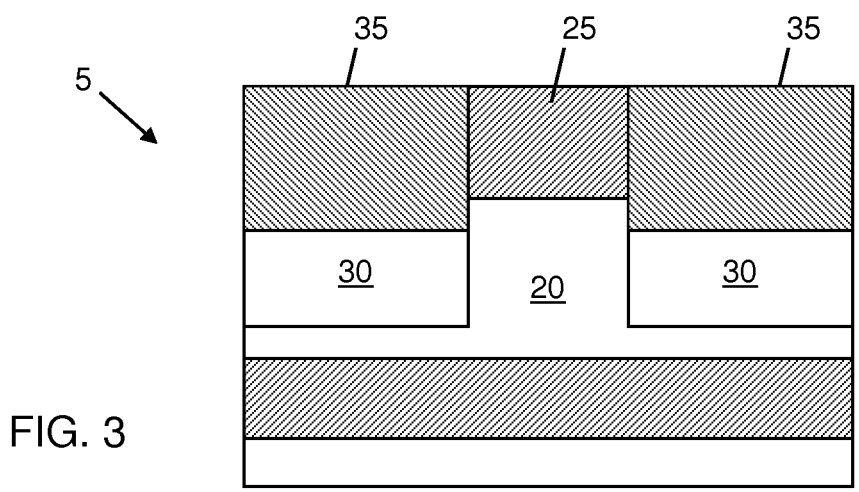

As shown in FIG. 3, a mask 35 is formed on the entire upper surface of the wafer 5, including on the upper surfaces of the islands 30. The mask 35 initially covers the sacrificial gate 25, and is thinned after forming to expose a top portion of the sacrificial gate 25. In embodiments, the mask 35 is composed of a material that is different than the sacrificial gate 25, the active layer 20, and the islands 30. In a particular non-limiting example, the mask 35 is composed of nitride, the sacrificial gate 25 is composed of oxide and the active layer 20 is composed of silicon, although the invention is not limited to this combination of materials and other combinations may be used. The mask 35, when nitride, may be formed using CVD or other suitable process. The mask 35 may be thinned using a polish process, such as a chemical mechanical polish (CMP).

Figure 4:
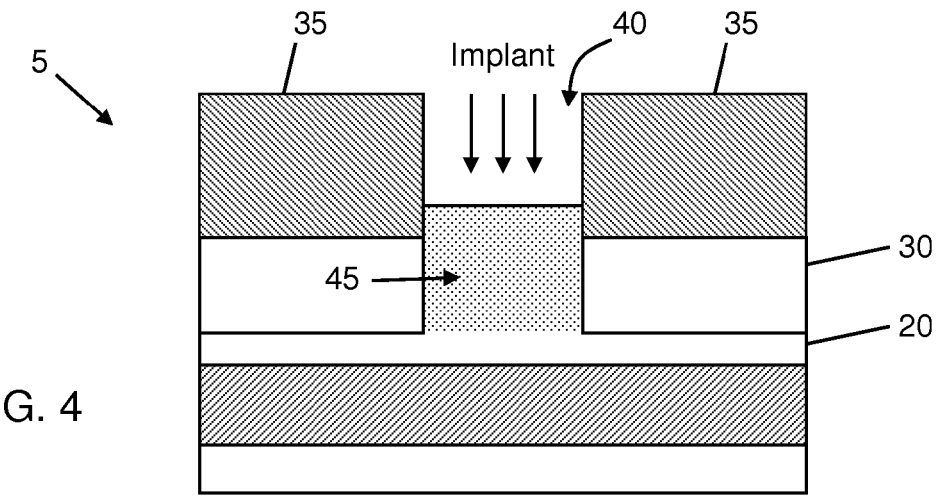

FIG. 4 depicts the removal of sacrificial gate 25 and ion-implantation of a portion of active layer 20. In embodiments, the sacrificial gate 25 is selectively removed using an etch process that does not appreciably remove the mask 35 and the active layer 20, e.g., a process that etches the material of the sacrificial gate 25 at a rate much faster than the material of the mask 35 and the active layer 20. Etching the sacrificial gate 25 forms a gate trench 40 in the mask 35 that exposes a top surface of the active layer 20.

Still referring to FIG. 4, in accordance with aspects of the invention, a channel region 45 of the active layer 20 is doped with an impurity. The impurity may be introduced into the active layer 20 using an ion implant process. In embodiments, the impurity is a p-type dopant, such as boron, indium, gallium, etc. The mask 35 covers the islands 30 and other portions of the active layer 20 during the ion implant process, such that the impurity is confined to a channel region 45 of the active layer 20 that is exposed by the gate trench 40. In embodiments, the channel region 45 is heavily doped, for example, having a concentration in a range of about $1\times10^{18}$/cm$^3$ to about $2\times10^{19}$/cm$^3$ (e.g., about 1e18 cm$^{-3}$ to about 2e19 cm$^{-3}$).

Figure 5:
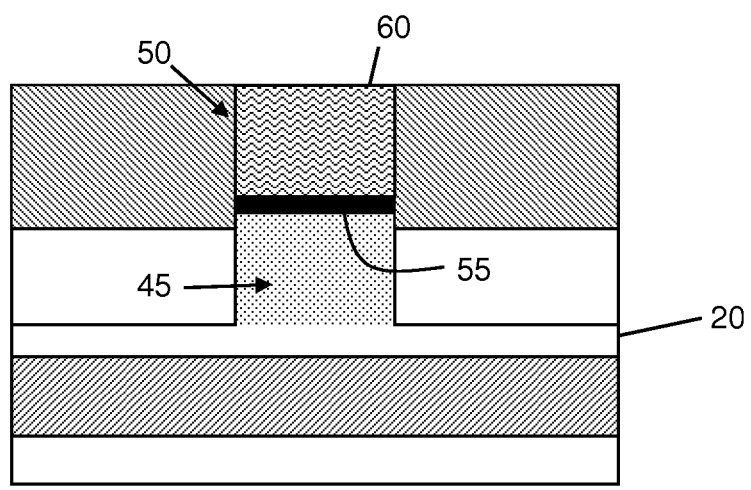

FIG. 5 shows the formation of a gate 50 in the gate trench. The gate 50, which may be referred to as a replacement gate, may be formed using conventional semiconductor material and fabrication techniques. For example, the gate 50 may comprise a gate dielectric 55 formed on the exposed upper surface of the channel region 45 of the active layer 20, and a gate electrode 60 formed on the gate dielectric 55. The gate dielectric 55 may comprise, for example, silicon dioxide, hafnium oxide, or other conventional gate dielectric materials, and may be formed by CVD, for example. The gate electrode 60 may comprise, for example, one or more metals, polysilicon, or other conventional gate electrode materials, and may be formed by CVD, sputtering, or the like.

Figure 6:
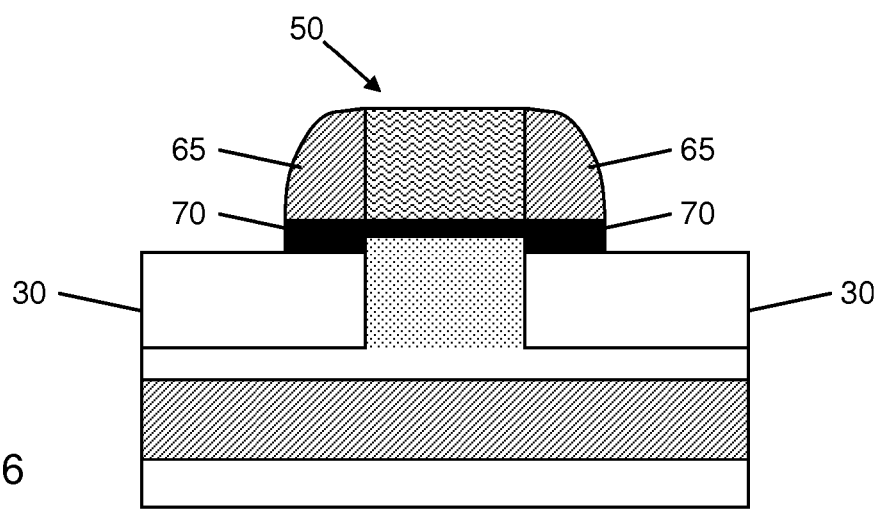

As depicted in FIG. 6, the mask 35 is removed and gate spacers 65 are formed on sidewalls of the gate 50. In embodiments, the mask 35 is stripped using an etching process that selectively removes the material of the mask 35 without appreciably removing the materials of the gate 50, active layer 20, and islands 30, e.g., by using an etch chemistry that removes the material of the mask 35 at a rate much faster than that of the gate 50, active layer 20, and islands 30. The gate spacers 65 may comprise any suitable dielectric material such as silicon oxide, silicon nitride, silicon oxynitride, or a combination thereof. The gate spacers 65 may be formed using conventional semiconductor fabrication processes. For example, gate spacers 65 may be formed by deposition of a conformal dielectric material layer and an anisotropic etch that removes horizontal portions of the conformal dielectric material layer. The remaining vertical portions of the conformal dielectric material layer constitute the gate spacers 65.

Still referring to FIG. 6, extensions 70 of the gate dielectric 55 may be formed prior to forming the gate spacers 65. The extensions 70 may be composed of the same material as the gate dielectric 55 and may be formed by depositing a layer of the material on the upper surface of the wafer 5, and masking and etching the material. Alternatively, the extensions 70 may be omitted and the gate spacers 65 may be formed directly on the islands 30.

Figure 7:
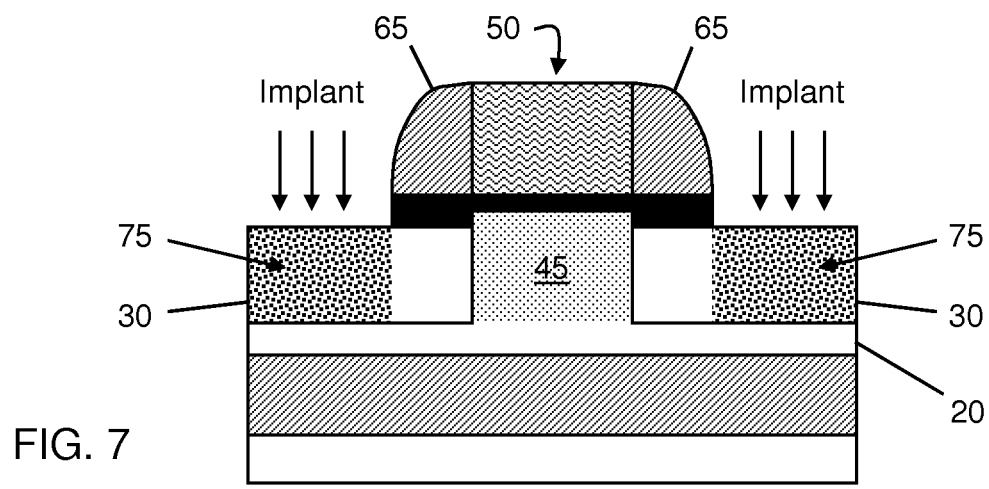

As shown in FIG. 7, an impurity is implanted into the islands 30 to form source/drain regions 75. In embodiments, the impurity is an n-type dopant, such as phosphorous, arsenic, antimony, or bismuth. The gate 50 and gate spacers 65 mask a portion of the islands 30 during the source/drain implant, such that there are undoped regions of the islands 30 between the p-type channel region 45 and the n+-type source/drain regions 75. In embodiments, the source/drain regions 75 are doped with a concentration in a range of, for example, about $1\times10^{20}/cm^3$ to about $5\times10^{20}/cm^3$ (e.g., about 1e20 $cm^{-3}$ to about 5e20 $cm^{-3}$).

Figure 8:
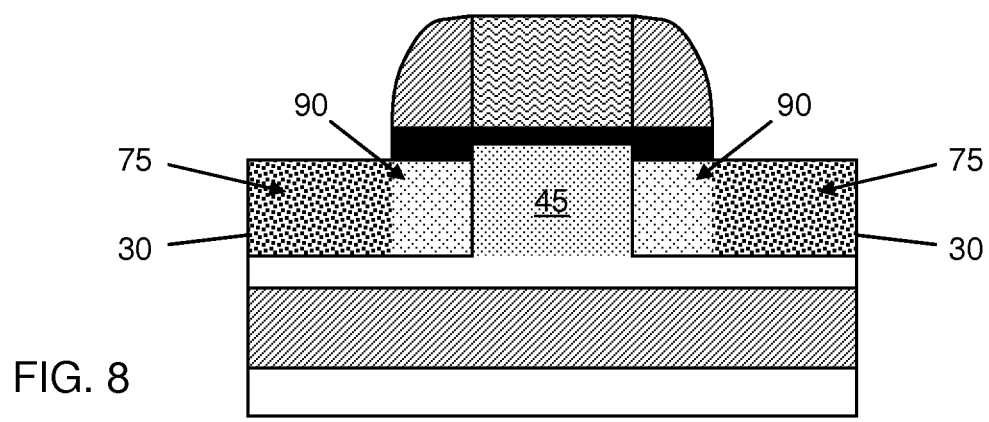

FIG. 8 shows the formation of lightly doped regions 90 between the p-type channel region 45 and the n+-type source/drain regions 75. In embodiments, the lightly doped regions 90 are formed by annealing the wafer 5, which causes atoms to migrate from the source/drain regions 75 and the channel region 45 into the undoped regions of islands 30. In particular, the annealing causes n-type atoms to migrate inward from the source/drain regions 75, and also causes p-type atoms to migrate outward from the channel 45. The migration of the two different types of atoms creates the p−-type lightly doped regions 90, which have a graded impurity concentration along the transverse (e.g., horizontal) direction. The regions 90 are lightly doped in that they have a lower impurity concentration than the channel region 45 and the source/drain regions 75. Due to the properties of the SiGe material of the islands 30, the p-type dopants diffuse relatively slowly from the channel region 45 into the lightly doped regions 90, whereas the n-type dopants diffuse relatively quickly from the source/drain regions 75 into the lightly doped regions 90. The anneal may be any suitable anneal, such as a rapid thermal anneal (RTA).

Figure 9:
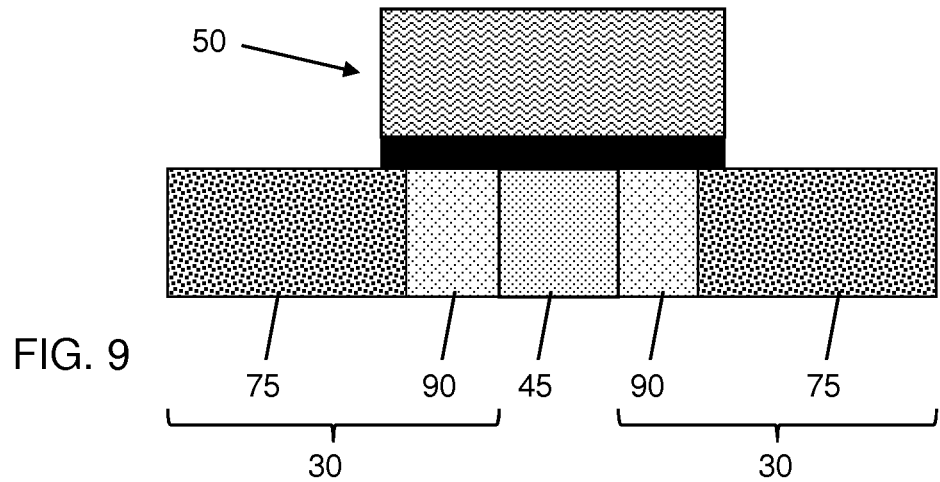

FIG. 9 shows a diagrammatic representation of the ZRAM cell of FIG. 8 in which the SiGe islands 30 extend under the outer edges of the gate 50, with the channel region 45 being heavily p-type doped silicon instead of SiGe. According to aspects of the invention, the channel region 45 (p-type), source drain regions 75 (n+-type), and graded, lightly doped regions 90 (p−-type) form a bi-polar structure under the gate 50, which permits the use of a lower drain bias (e.g., voltage) during a write operation of the ZRAM cell.

Figure 10:
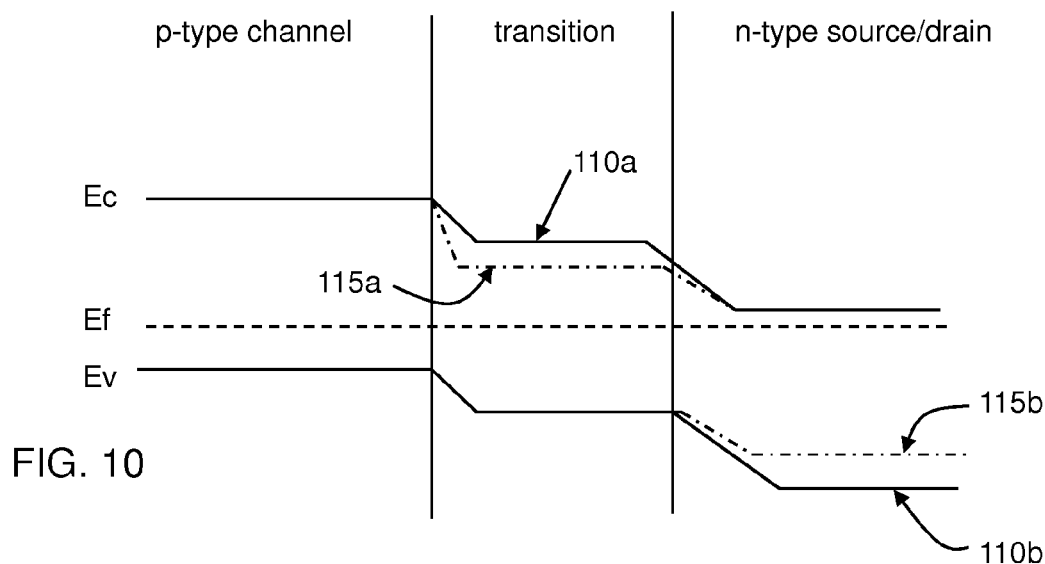
FIG. 10 shows a band diagram of a structure in accordance with aspects of the invention.

FIG. 10 shows band diagrams of ZRAM cells. The band diagrams depict half of the ZRAM cell from a center of the channel region to the drain region. The solid lines 110a-b show the conduction band (Ec) and valence band (Ev) for silicon only device. The dot-dashed 115a-b lines show the conduction band and valence band of a ZRAM cell in accordance with aspects of the invention that comprises a SiGe n+-type source drain region (e.g., region 75), a SiGe p−-type lightly doped transition region (e.g., region 90), and a Si p-type channel (e.g., channel 45). As depicted in FIG. 10, the lightly doped SiGe transition region under the gate has a smaller band gap than intrinsic silicon. Also, the SiGe drain region has a smaller bandgap than intrinsic silicon. These smaller band gaps enhance the impact ionization rate, which permits writing to the ZRAM cell at a lower drain bias, which in turn increases the margin (e.g., difference) between the write voltage and the read voltage. For example, a ZRAM cell according to aspects of the invention may have a write bias of about 1.7V, compared to a conventional ZRAM cell that has a write bias of about 2.5V.

Figure 11:
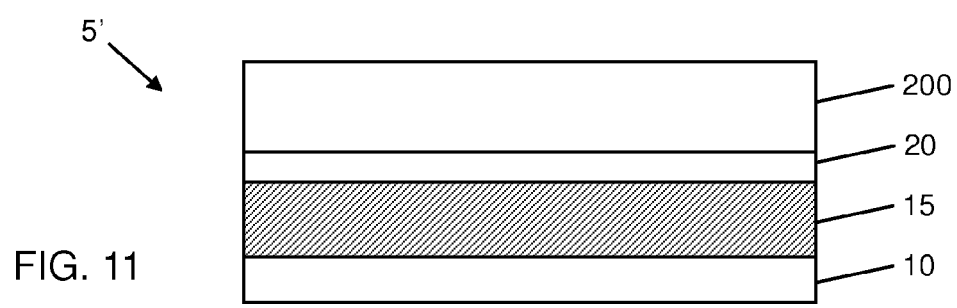
FIGS. 11-18 show views of structures and respective processing steps in accordance with aspects of the invention.

FIGS. 11-18 show views of structures and respective processing steps in accordance with aspects of the invention. More specifically, FIG. 11 shows a portion of a silicon on insulator (SOI) wafer 5' comprising a substrate 10, and insulator layer 15 on the substrate 10, and an active semiconductor layer 20 on the insulator layer 15, which may be the same as those elements described with respect to FIG. 1. With continued reference to FIG. 11, the wafer 5 also includes a SiGe layer 200 on the active layer 20. The SiGe layer 200 may be formed using conventional processes, e.g., epitaxial growing, and may have any desired thickness.

Figure 12:
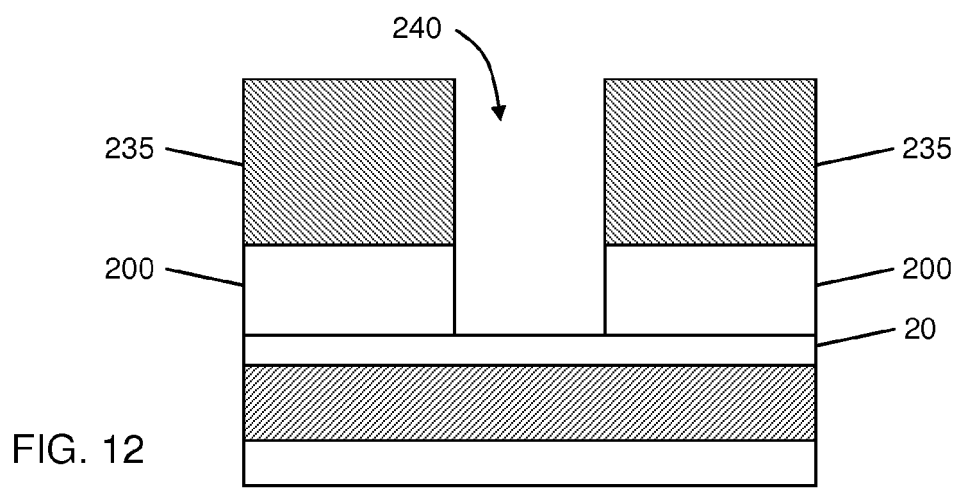

As shown in FIG. 12, a mask 235 is formed on the SiGe layer 200, the mask 235 is patterned, and a portion of the SiGe layer 200 is etched through the patterned mask 235. In embodiments, the mask 235 is a hard mask, such as nitride, and may be formed and patterned using conventional processes, e.g., CVD and photolithographic masking and etching. A separate etch may be used to etch the SiGe layer 200 through the patterned mask 235. The etch of SiGe layer 200 may be timed or otherwise controlled to extend to or slightly into active layer 20, thereby exposing an upper surface of the active layer 20 in a trench 240 defined by the mask 235 and SiGe layer 200.

Figure 13:
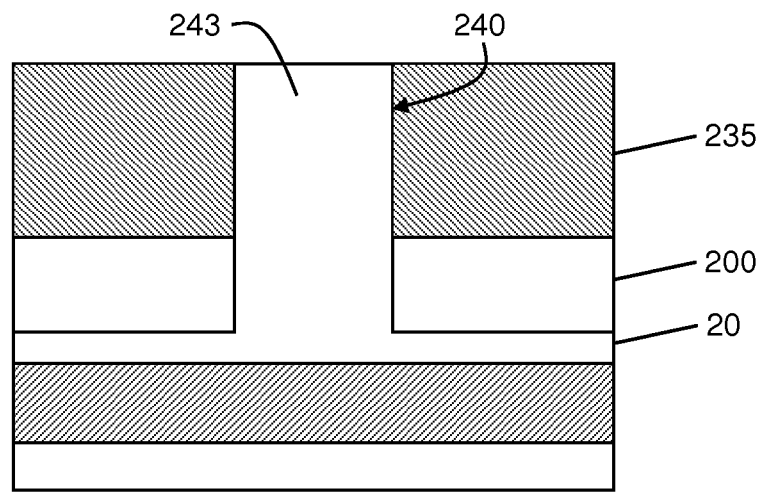

As shown in FIG. 13, the trench 240 is filled with silicon 243. In embodiments, the silicon 243 is epitaxially grown from the exposed surface of the active layer 20 in the trench 240. The top surface of the wafer 5 may be planarized, e.g., using CMP, after growing the silicon 245.

Figure 14:
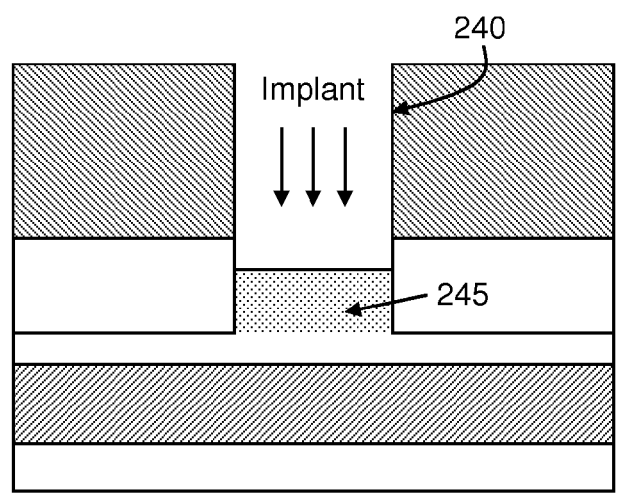

FIG. 14 shows thinning the silicon in the trench 240 and performing an ion implant in the thinned silicon to form a channel region 245. In embodiments, the silicon is thinned using a recess etch, e.g., a timed RIE process that selectively etches silicon. In embodiments, the ion implant introduces a p-type dopant into the remaining silicon after the thinning, and may be similar to that described with respect to FIG. 4.

Figure 15:
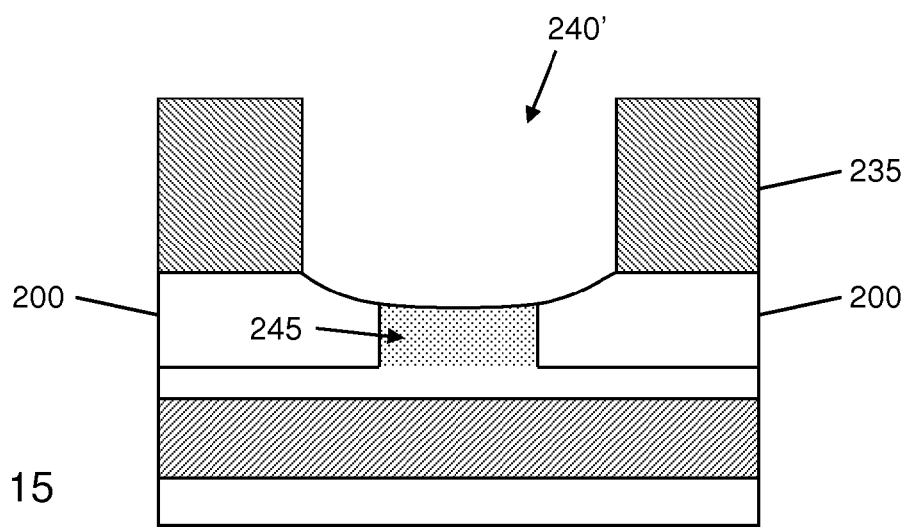

FIG. 15 shows a mask trimming step that increases the size of the initial trench to form a gate trench 240'. In embodiments, the mask trimming involves a timed etch (e.g., RIE) that removes portions of the mask 235 and SiGe 200. In aspects of the invention, the gate trench 240' is wider in a transverse (e.g., horizontal) direction than the channel region 245, such that the gate trench 240' extends vertically over (e.g., overlaps) portions of the SiGe 200. A cleaning step may be performed after the mask trimming step.

Figure 16:
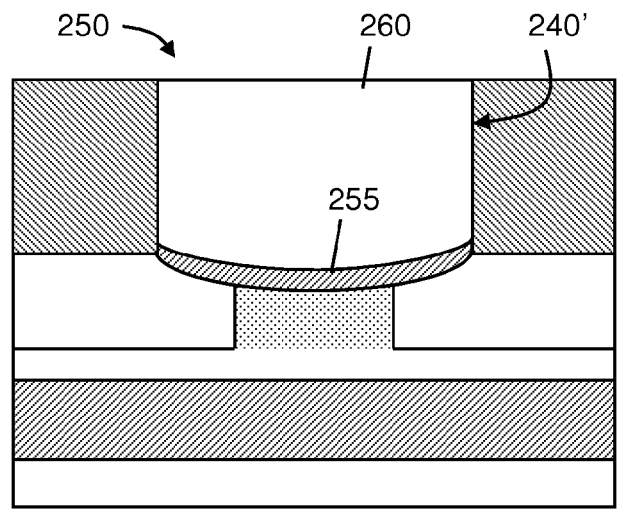

FIG. 16 shows forming a gate 250 including a gate dielectric 255 and gate electrode 260 in the gate trench 240'. The gate dielectric 255 may comprise, for example, silicon dioxide, hafnium oxide, or other conventional gate dielectric materials, and may be formed by chemical oxidation, for example. The gate electrode 260 may comprise, for example, one or more metals, polysilicon, or other conventional gate electrode materials, and may be formed by CVD, sputtering, or the like. The top of the structure may be planarized (e.g., using CMP) after forming the gate electrode 260.

Figure 17:
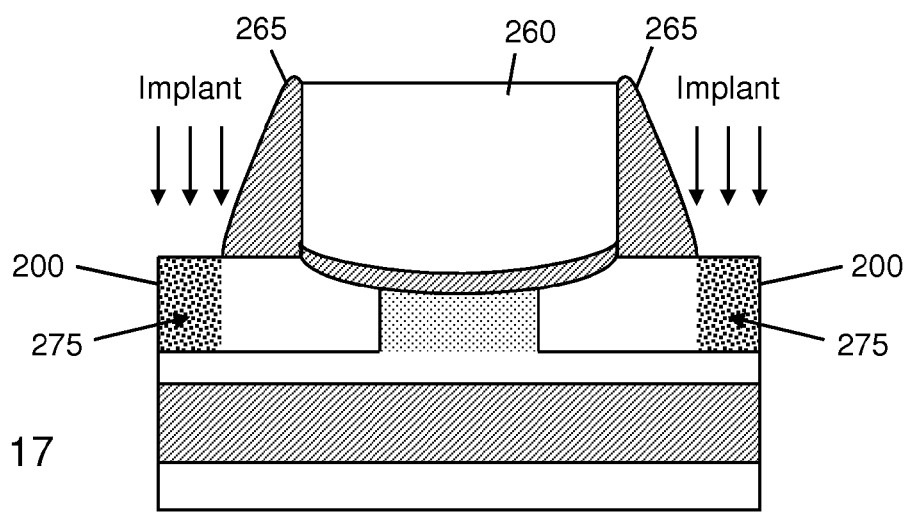

As depicted in FIG. 17, the mask 235 is stripped, gate spacers 265 are formed on sides of the gate electrode 260 and the SiGe 200, and source/drain regions 275 are formed in the SiGe 200. The steps of FIG. 17 may be performed, for example, in a manner similar to that described with respect to FIGS. 6 and 7.

Figure 18:
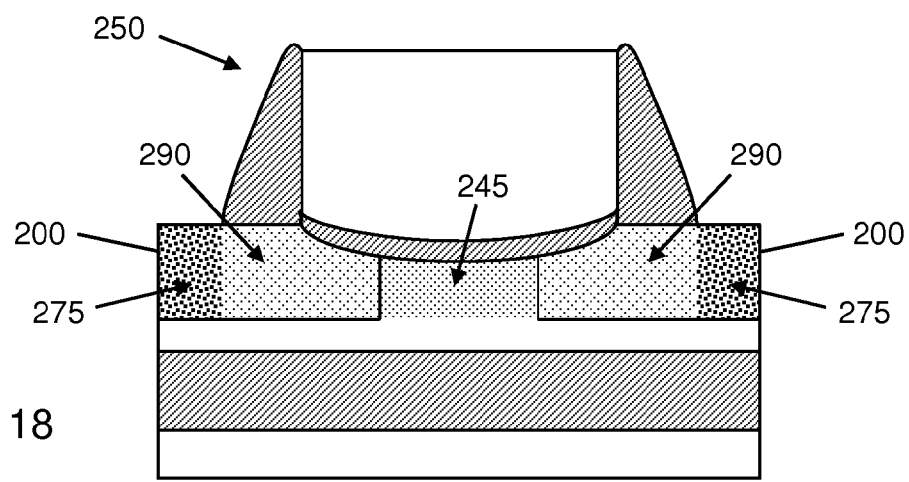

FIG. 18 shows the formation of lightly doped regions 290 in the SiGe 200 between the p-type channel region 245 and the n+-type source/drain regions 275. In embodiments, the structure is annealed to cause n-type atoms to migrate inward from the source/drain regions 275, and to causes p-type atoms to migrate outward from the channel region 245. The migration of the two different types of atoms creates the p−-type lightly doped regions 290, which have a graded impurity concentration along the horizontal direction. In accordance with aspects of the invention, the channel region 245 (p-type), source drain regions 275 (n+-type), and graded, lightly doped regions 290 (p−-type) form a bi-polar transistor under the gate 250, which permits the use of a lower drain bias (e.g., voltage) during a write operation of the ZRAM cell. In aspects of the invention, the lightly doped regions 290 extend under the lateral edges of the gate 250.

Figure 19:
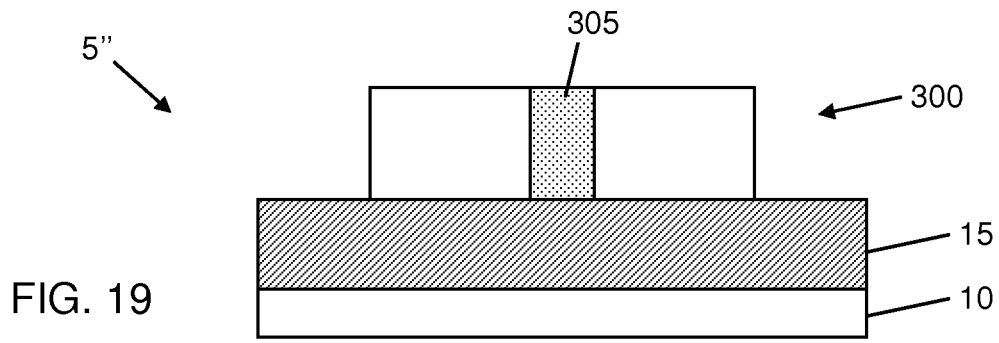
FIGS. 19-26 show views of structures and respective processing steps in accordance with aspects of the invention.

FIGS. 19-26 show views of structures and respective processing steps in accordance with aspects of the invention. More specifically, FIG. 19 shows a portion of a silicon on insulator (SOI) wafer 5" comprising a substrate 10 and insulator layer 15 on the substrate 10, which may be the same as those elements described with respect to FIG. 1. With continued reference to FIG. 19, a fin 300 of active semiconductor material is formed on the insulator layer 15. The fin 300 may be formed in a conventional manner, such as by patterning a layer of semiconductor material (e.g., silicon) that is initially present on the insulator layer 15 in an SOI wafer.

Still referring to FIG. 19, a channel region 305 is formed in the fin 300 by introducing p-type dopant into the fin 300. For example, masking and ion implant processes may be used to selectively implant p-type atoms into channel region 305.

Figure 20:
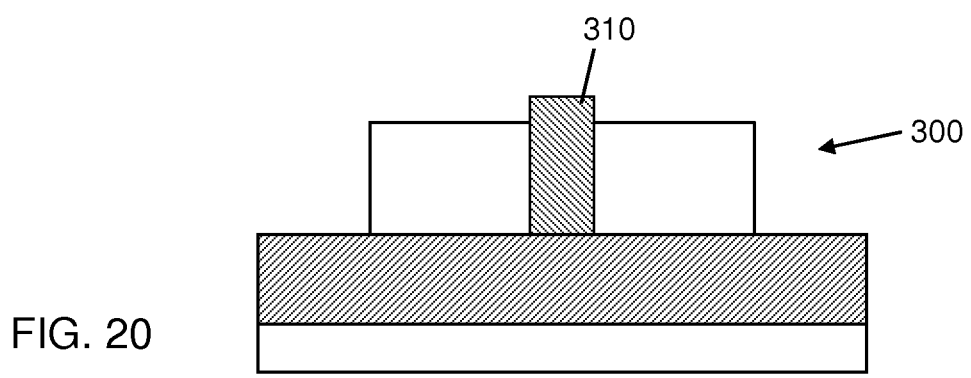

FIG. 20 shows forming a sacrificial gate 310 on three sides of the fin 300 and over the channel region 305. The sacrificial gate 310 may comprise any suitable material, e.g., nitride, and may be formed using conventional semiconductor fabrication processes, e.g., CVD and photolithographic masking and etching.

Figure 21:
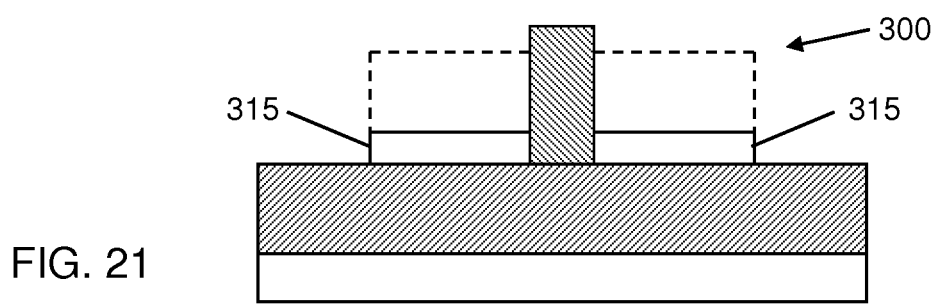
Figure 22:
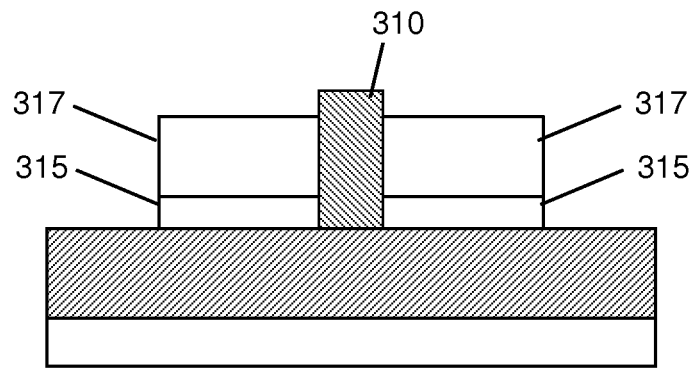

As depicted in FIG. 21, the portions of the fin 300 that are uncovered by the sacrificial gate 310 are etched, e.g., using a timed RIE process, resulting in thinned Si regions 315. The dashed line in FIG. 21 represents the initial shape of the fin prior to etching. As depicted in FIG. 22, SiGe fins 317 are formed on the thinned Si regions 315 by epitaxially growing SiGe from the thinned Si regions 315. The sacrificial gate 310 prevents formation of SiGe on the p-type channel region of the fin.

Figure 23:
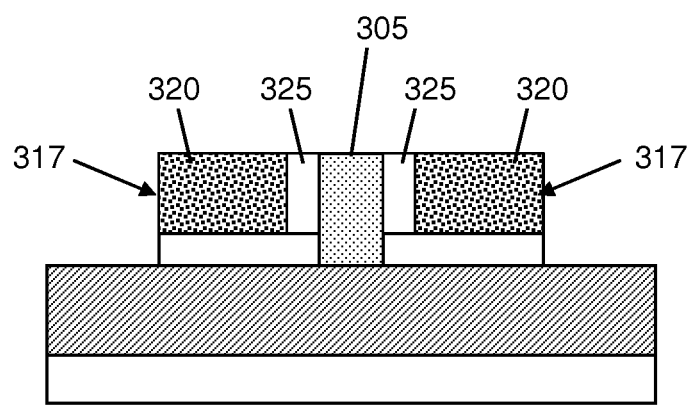

As depicted in FIG. 23, the sacrificial gate 310 is removed, e.g., using a stripping process that selectively removes the material of the sacrificial gate 310. FIG. 23 also shows forming source/drain regions 320 in the SiGe fins 317, e.g., by implanting n-type ions in the selected regions of the SiGe fins 317. In aspects of the invention, the structure is masked (e.g., using patterned photoresist) during the ion implant of the source/drain regions 320 to leave undoped regions 325 of the SiGe fins 317 between the source/drain regions 320 and the channel region 305. The doping of source/drain regions 320 may be performed before or after removing the sacrificial gate 310.

Figure 24:
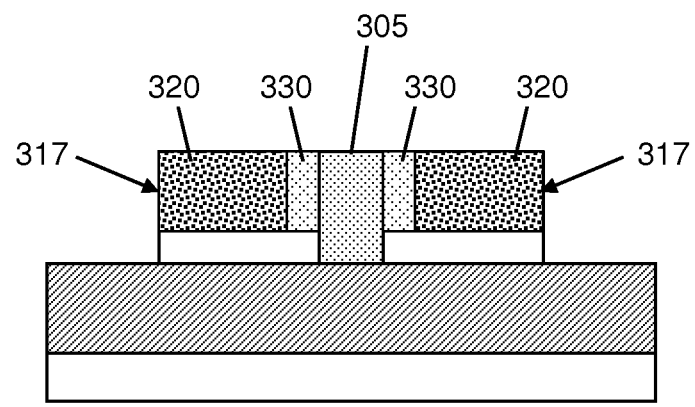

FIG. 24 shows forming lightly doped SiGe regions 330 in the undoped regions of the SiGe fins 317 between the source/drain regions 320 and the channel region 305. In embodiments, the structure is annealed (e.g., rapid thermal anneal), which causes n-type atoms from the source/drain regions 320 and p-type atoms from the channel region 305 to migrate and form the lightly doped SiGe regions 330.

Figure 25:
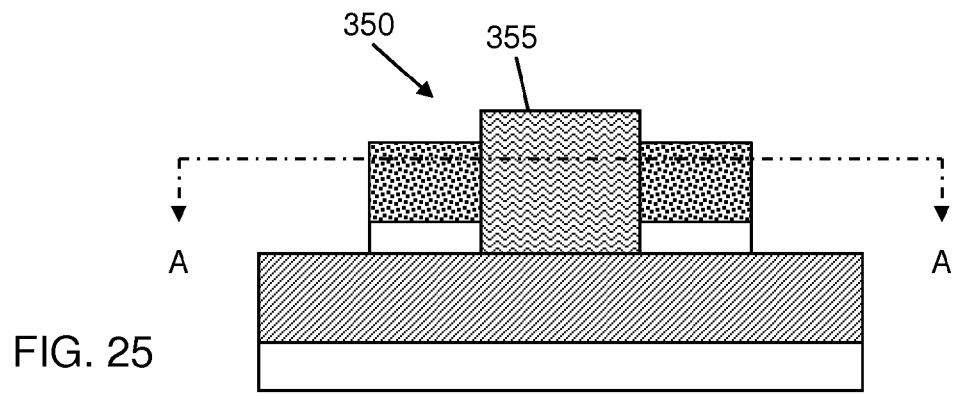
Figure 26:
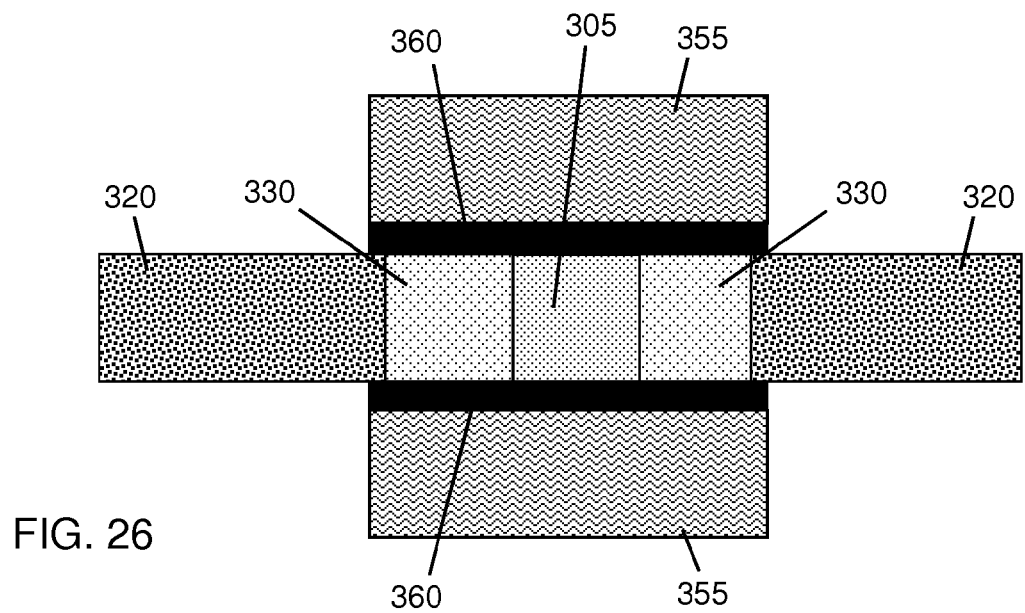

FIG. 25 shows forming a gate 350 including a gate dielectric and gate electrode 355 over the channel region on the fin 300. The gate dielectric and gate electrode may be composed of conventional materials and may be formed using conventional semiconductor fabrication techniques. FIG. 26 shows a top down view of the structure of FIG. 25 along line A-A. The fin-type ZRAM cell shown in FIG. 26 includes p-type Si channel region 305, n-type SiGe source/drain regions 320, lightly doped SiGe regions 330, gate dielectric 360, and gate electrode 355.

Implementations of the invention may thus be used to provide a zero-capacitor (ZRAM) memory cell with enhanced read/write margin comprising: a source region, and a drain region comprising a silicon alloy partly composed of a SiGe material having a smaller bandgap than intrinsic Silicon; a gate structure, adjacent to the drain and source regions, comprising a silicon alloy partly composed of a SiGe material having a smaller band gap than intrinsic Silicon; a channel region comprising p-type doped silicon located between the source region and the drain region, such that the SiGe material comprising the gate structure is present under a first edge and a second edge of the gate structure; and an n-type doped region separated from said channel region by a portion of the p-type SiGe region. Minority carriers in the body of a floating SOI device are used as the storage medium. Aspects of the invention enhance the read-write margin by utilizing a SiGe material in the source and drain and gate with a smaller bandgap than intrinsic silicon, which enhances the impact ionization rate. This construction facilitates writing at a lower bias, thereby enhancing the read/write margin. A heavily p-type doped silicon region is included in the channel, such that the SiGe is only under the edges of the gate. Due to the properties of SiGe, p-type dopants will diffuse very slowly, while n-type dopants diffuse quickly during anneal of the structure. This creates a graded, lightly doped region in the SiGe such that the field can be controlled and the bipolar turn-on bias is high.

Figure 27:
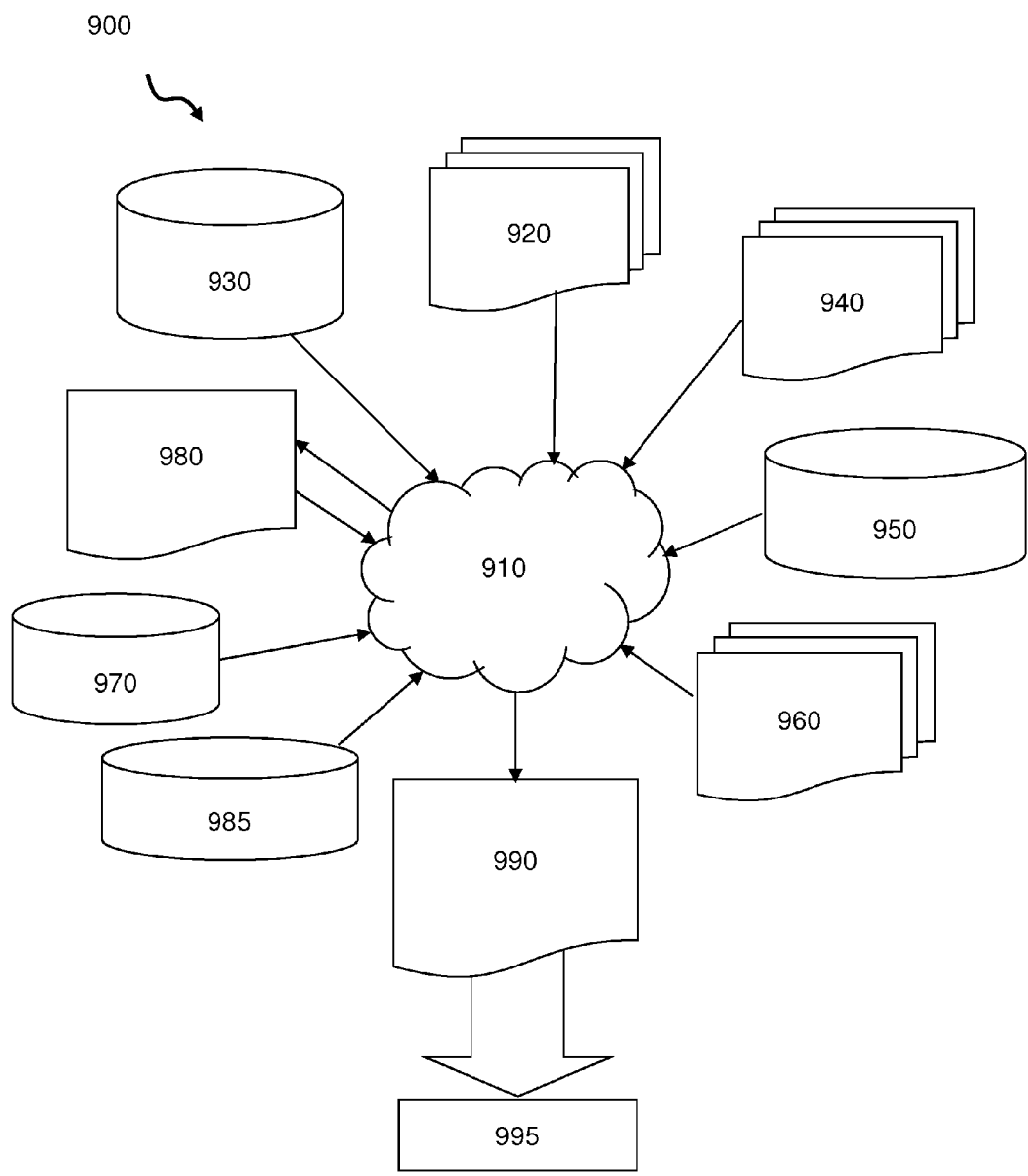
FIG. 27 is a flow diagram of a design process used in semiconductor design, manufacture, and/or test.

FIG. 27 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9 and 11-26. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 27 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9 and 11-26. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 and 11-26 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9 and 11-26. In one embodiment, design structure 990 may comprise a compiled, executable HDL simulation model that functionally simulates the devices shown in FIGS. 1-9 and 11-26.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9 and 11-26. Design structure 990 may then proceed to a stage 995 where, for example, design structure 990: proceeds to tape-out, is released to manufacturing, is released to a mask house, is sent to another design house, is sent back to the customer, etc.

What is claimed is:

1. A method of manufacturing a semiconductor structure, comprising:
    forming a channel region by doping a first material with a first type of impurity;
    forming undoped islands of a second material adjacent the channel region;
    forming a gate structure over the channel region, and over first portions of the undoped islands, wherein an interface between the channel region and the gate structure is at higher elevation than an interface between the undoped islands and the gate structure from a surface of a substrate;
    forming source/drain regions by doping the second material with a second type of impurity different than the first type of impurity into second portions of the undoped islands while leaving the first portions undoped, wherein the second material has a smaller bandgap than the first material; and
    forming lightly doped regions in the first portions of the undoped islands between the channel region and the source/drain regions after the forming of the source/drain regions, wherein the lightly doped regions comprise the second material, and the source/drain regions and the lightly doped regions having a substantially same uniform thickness.

2. The method of claim 1, wherein the first material is comprised in an active layer of a silicon on insulator substrate, and further comprising:
    masking the active layer with a sacrificial gate;
    forming trenches in unmasked portions of the active layer; and
    growing the second material in the trenches.

3. The method of claim 2, further comprising:
masking the second material in the trenches;
removing the sacrificial gate to form a gate trench; and
performing the doping of the first material on a portion of the first material exposed in the gate trench.

4. The method of claim 3, wherein the forming the gate structure comprises:
forming a gate dielectric in the gate trench; and
forming a gate electrode on the gate dielectric in the gate trench.

5. The method of claim 4, further comprising forming gate spacers on the gate electrode, wherein the forming the lightly doped regions comprises annealing the semiconductor structure to cause atoms to migrate from the channel region and the source/drain regions into regions underneath the gate spacers.

6. The method of claim 1, further comprising:
growing a layer of the second material on a layer of the first material;
forming a mask on the layer of the second material; and
exposing a portion of the first material by forming a trench in the layer of the second material through the mask.

7. The method of claim 6, wherein the doping the first material is performed through the mask.

8. The method of claim 6, further comprising trimming the mask to create a gate trench that is wider than the channel region.

9. The method of claim 8, wherein the forming the gate structure comprises:
forming a gate dielectric in the gate trench; and
forming a gate electrode on the gate dielectric in the gate trench.

10. The method of claim 9, further comprising forming gate spacers on the gate structure, wherein the forming the lightly doped regions comprises annealing the semiconductor structure to cause atoms to migrate from the channel region and the source/drain regions into regions underneath the gate spacers.

11. The method of claim 1, wherein the forming the channel region comprises forming the channel region in a fin composed of the first material.

12. The method of claim 11, further comprising:
forming a sacrificial gate over the fin at the channel region;
removing portions of the fin; and
growing the second material in the removed portions of the fin.

13. The method of claim 11, wherein the forming the source/drain regions comprises masking a first portion of the second material and forming the source/drain regions in a second portion of the second material.

14. The method of claim 13, wherein the forming the lightly doped regions comprises annealing the semiconductor structure to cause atoms to migrate from the channel region and the source/drain regions into the first portion of the second material.

15. The method of claim 1, wherein:
the first material comprises silicon;
the second material comprises silicon-germanium;
the first type of impurity is p-type; and
the second type of impurity is n-type.

16. A method of forming a semiconductor structure, comprising:
forming a sacrificial gate on a layer of silicon;
forming trenches in the layer of silicon;
forming undoped silicon-germanium islands in the trenches;
forming a mask directly on the undoped silicon-germanium islands;
removing the sacrificial gate to form a gate trench defined by the mask;
forming a channel region in a portion of the layer of silicon exposed by the gate trench;
forming a gate dielectric and a gate electrode over the channel region in the gate trench;
removing the mask entirely;
forming gate spacers that mask first portions of the undoped silicon-germanium islands; doping second portions of the undoped silicon-germanium islands while leaving the first portions undoped;
forming source/drain regions in the second portions of the silicon-germanium islands by the doping of the second portions; and
annealing the semiconductor structure to cause atoms to migrate from the channel region and the source/drain regions into the first portions of the undoped silicon-germanium islands to form lightly doped regions under the gate spacers, wherein the lightly doped regions and the source/drain regions having a substantially same uniform thickness.

17. The method of claim 1, wherein the forming of the lightly doped regions comprises annealing the semiconductor structure to cause atoms to migrate from the channel region and the source/drain regions into regions underneath the gate structure such that the migration of atoms from the channel region will be at a slower rate than the migration of atoms from the source/drain regions so that the lightly doped regions have a graded impurity concentration along a transverse direction of the lightly doped regions.

18. the method of claim 16, wherein the forming of the lightly doped regions comprises annealing the semiconductor structure to cause atoms to migrate from the channel region and the source/drain regions into regions underneath the gate spacers such that the migration of atoms from the channel region will be at a slower rate than the migration of atoms from the source/drain regions so that the lightly doped regions have a graded impurity concentration along a transverse direction of the lightly doped regions.

* * * * *